United States Patent [19]

Kato

[11] Patent Number: 4,739,158
[45] Date of Patent: Apr. 19, 1988

[54] APPARATUS FOR THE DETECTION OF PATTERN EDGES

[75] Inventor: Kinya Kato, Tokyo, Japan

[73] Assignee: Nippon Kogaku K. K., Tokyo, Japan

[21] Appl. No.: 909,211

[22] Filed: Sep. 19, 1986

[30] Foreign Application Priority Data

Sep. 24, 1985 [JP] Japan .................................. 60-210649

[51] Int. Cl.$^4$ ............................................. G01J 1/20
[52] U.S. Cl. ...................................... 250/201; 356/4
[58] Field of Search ..................... 250/201 AF, 204; 354/403; 356/1, 4

[56] References Cited

U.S. PATENT DOCUMENTS 3,758,209 9/1973 Harvey ........................... 250/201 AF
4,112,309 9/1978 Nakazawa et al. .................. 250/560
4,484,069 11/1984 Brenholdt ............................. 356/4

Primary Examiner—David C. Nelms
Assistant Examiner—Khaled Shami
Attorney, Agent, or Firm—Shapiro and Shapiro

[57] ABSTRACT

Apparatus for detecting the edge of a pattern on an object surface is disclosed. The apparatus includes a light source for emitting a collimated light beam, a condensing optical system for forming an elongated light spot of the collimated light beam on the object surface, an image-forming optical system for forming an image of the elongated light spot by focusing the reflected light from the object surface, a detector for forming an output signal corresponding to the reflected light from the spot image, an image rotator and a driving member. The elongated light spot is formed by means of slit. The direction of the slit is changed by the driving member to change the direction of the elongated light spot on the object surface. The driving member also drives the image rotator so as to keep the direction of the reflected spot image unchanged irrespective of the change of the direction of the slit.

13 Claims, 3 Drawing Sheets

APPARATUS FOR THE DETECTION OF PATTERN EDGES

BACKGROUND OF THE INVENTION

1. Field of the Invention

The present invention relates to apparatus for detecting the edges of a pattern formed on an object by scanning the object surface with a laser beam.

2. Related Background Art

The above-mentioned type of edge detection apparatus has been applied, for example, to a line width measuring apparatus of the type in which the line width of a very fine pattern such as an integrated circuit pattern is measured by photoelectrically detecting the edges of the fine pattern.

U.S. Pat. No. 4,112,309 has disclosed apparatus for photoelectrically measuring the coordinates of a pattern such as a pattern formed on a semiconductor wafer placed on a moving stage. The known apparatus comprises a laser, a focusing optical system for focusing the laser light beam to form a laser spot on the wafer, means for oscillating the laser spot on the pattern and a detector for scanning the pattern with the oscillating laser spot and detecting the scattered light from the edge of the scanned pattern. The direction of scanning is changed in accordance with the direction of the edge of the pattern. When the scanning direction is changed, it is necessary to change also the direction of the oscillation of the laser spot. To this end, in the prior art apparatus, there is provided an image rotator in the focusing optical system.

The image rotator must be mounted very precisely so that its rotation axis may be accurately aligned with the optical axis of the focusing optical system. However, it is difficult to completely exclude error in manufacturing or assembling the apparatus. If any error is introduced in the alignment of the axis of the image rotator, some measuring error may be caused by it because the center of the laser spot whose direction of oscillation is changed by the rotation of the image rotator is deviated from the optical axis of the objective lens by the alignment error.

In order to prevent such measuring error, the deviation of the spot center from the optical axis must be corrected every time after the rotation of the image rotator by a certain rotational angle. Therefore, a very large quantity of work and time is required for this correction. This has been one of the most important problems involved in the prior art apparatus.

SUMMARY OF THE INVENTION

Accordingly, an object of the present invention is to provide an edge detecting apparatus in which the center of the beam spot remains unshifted at the changeover of the scanning direction.

To attain this object, the apparatus according to the present invention includes optical means for processing a laser beam into a directional beam. Light source means emits a collimated light beam toward a focusing optical system for forming a laser spot on an object. The aforesaid optical means is disposed in the collimated light beam between said light source means and a condensing optical system. By said optical means the laser beam is processed into a directional beam which has a directivity on the surface of the object. An image rotator is disposed in a detection optical system which detects light reflected on or scattered by the object surface. In response to the change of the direction in which the object surface is scanned by the laser spot, the direction of the directional beam is changed. Synchronously with the change of the direction, the image rotator is rotated to return the changed direction of the directional beam back to the original direction within the detection optical system.

In a preferred embodiment of the invention, the directional beam is a beam elongated in a direction on the object surface. The elongated beam is formed by a slit screen disposed in the collimated light beam. Since the slit screen is in the collimated light beam, any deviation of the slit from the optical axis can not shift the condensed point of the elongated beam on the object surface. Therefore, even when the slit screen is rotated about the optical axis to change the direction of the elongated beam on the object surface, the center of the elongated beam is never shifted. The center of the beam always remains unchanged.

The directional beam may be an oscillating spot as used in the prior art apparatus of the aforementioned U.S. Patent, that is to say, a laser spot oscillating in a direction on the object surface.

In another preferred embodiment of the invention, the condensing optical system and the detection optical system are composed of a polarized beam splitter and a quarter wavelength plate. In this embodiment, the loss of light is reduced and the efficiency of detection is increased, which enables the use of a smaller output laser light source. Forthermore, in this embodiment, the detection optical system can contain an inverted beam expander for decreasing the beam diameter to realize a more compact construction of the apparatus.

DESCRIPTION OF THE PREFERRED EMBODIMENTS

An embodiment of the present invention is shown in FIGS. 1 to 4.

Figure 1:
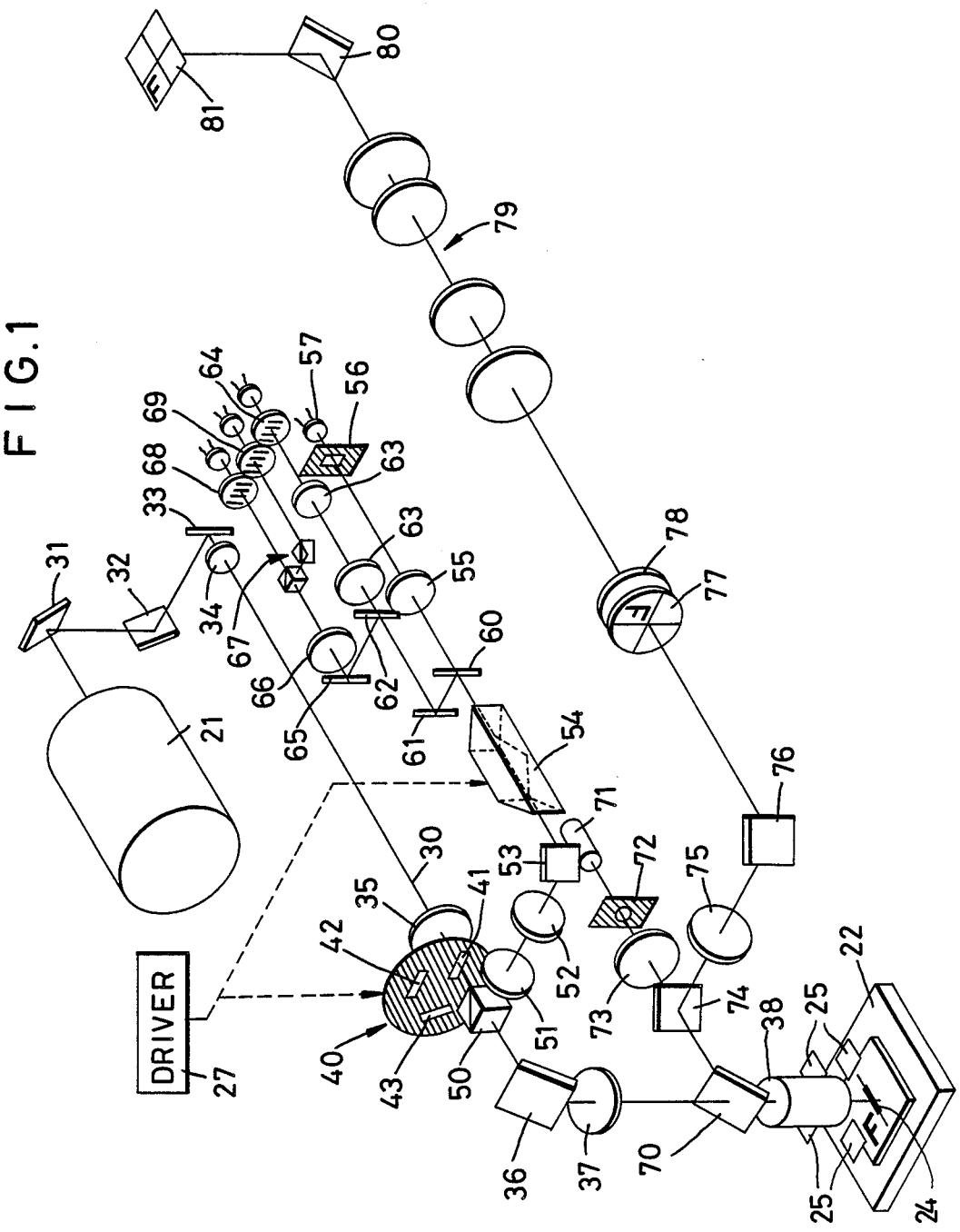
FIG. 1 schematically shows the arrangement of the optical systems of the apparatus in which the present invention has been embodied.

Referring first to FIG. 1, a laser light source 21 emits a linearly polarized laser beam (P-polarized laser beam). The collimated beam from the laser light is focused on the surface of an object such as a semiconductor wafer or mask held on a moving stage 22 through a condensing optical system. In the collimated beam there is interposed a slit screen 40 to form an elongated laser spot on the object surface which has a pattern formed thereon. A detector 25 is provided to detect the scattered light from the edge of the pattern. The normally reflected light is detected by a detection optical system. The apparatus further includes an automatic focus-detecting system and a viewing optical system for viewing the pattern.

The beam emitted from the laser light source 21 is at first reflected by mirrors 31, 32 and 33 and then the beam width is expanded by beam expanders 34 and 35. The expanded beam enters the condensing optical system comprising a mirror 36, a quarter wavelength plate 37 and an objective 38.

The slit screen 40 is in the path of the collimated beam between the beam expanders 34, 35 and a polarized beam splitter 50 which will be described later. The slit screen 40 is rotatable in a plane normal to the optical axis. The rotation axis of the slit screen 40 is shifted from the optical axis of the condensing optical system. When the slit screen is rotated about the rotation axis, the elongated laser spot 24 formed on the surface of the object rotates on the object surface.

Figure 2:
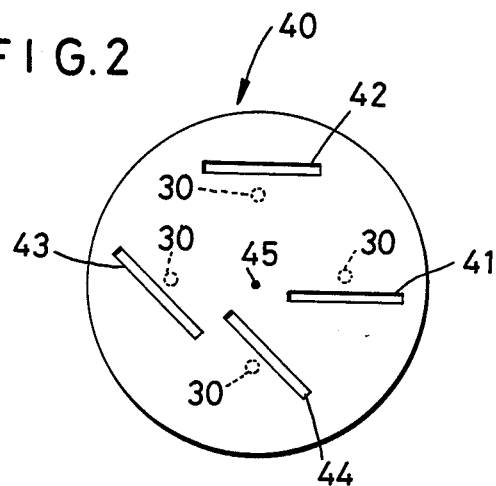
FIG. 2 is a plan view of the rotary slit screen in the apparatus.

As seen best in FIG. 2, the slit screen 40 has four slits 41, 42, 43 and 44 of the same size. Of the four slits the slit 42 extends nearly in the radial direction to the rotation axis 45. The second slit 42 is spaced about 90° from the first slit 41 around the rotation axis and extends tangentially. The third and fourth slits 43 and 44 are about 180° spaced from the first and second slits 41 and 42 respectively. The two slits 43 and 44 are disposed 45° inclined to the other two slits.

By rotating the slit screen 40 stepwise by 90° per step, the slits are put into the condensing optical system one by one successively. Since the light beam passing through the slit is a collimated beam, the center position of the elongate laser spot formed by every slit never changes even when the rotation axis 45 of the slit screen 40 has some deviation caused by any mechanical error.

It is well known that the longitudinal direction of the slit on the optical axis 30 and the longitudinal direction of the laser spot on the object surface optically intersect at right angles. In other words, passing through the slit 41, the collimated beam from the lens 35 becomes a beam which has an intensity distribution shortened in a direction orthogonal to the slit. This beam enters the objective lens 38 by which the beam is concentrated so that the exit beam from the lens 38 forms a laser spot on the object surface. Owing to diffraction, the laser spot has an intensity distribution elongated in the direction orthogonal to the slit and shortened in the longitudinal direction of the slit.

Therefore, the direction of the elongated laser spot can be brought into coincidence with the direction of the edge of the pattern to be measured by changing the direction of the slit through the rotation of the slit screen 40.

Figure 3:
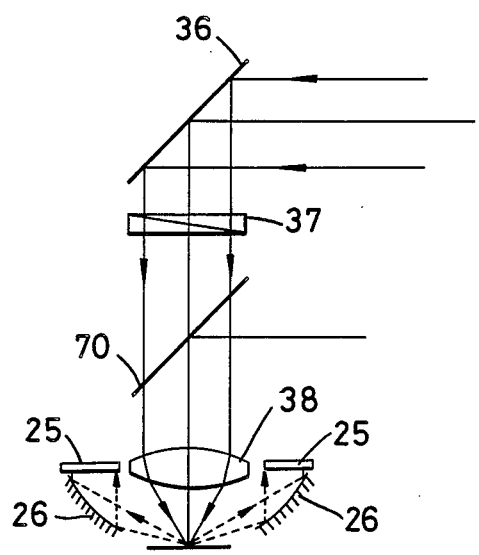
FIG. 3 is an explanatory view of a portion of the optical system shown in FIG. 1.

Referring to FIG. 3, a ring-shaped concave mirror 26 is provided under the detector 25. The mirror 26 is so formed as to reflect the scattered light from the pattern edge toward the detector 25.

The detection optical system for detecting the light normally reflected on the object surface comprises a polarized beam splitter 50, inverted beam expanders 51, 52, a mirror 53, an image-rotating prism 54, an image-forming lens 55, a slit plate 56 and a photosensor 57. The polarized beam splitter 50 is disposed on the optical axis of the condensing optical system. It transmits P-polarized laser beam and reflects S-polarized laser beam. The inverted beam expanders 51 and 52 reduce the beam width of the collimated laser beam reflected by the polarized beam splitter 50. The image-rotating prism 54 is of the construction known per se. The slit plate 56 has a vertically elongated slit and is positioned at the position of the pupil of the image-forming lens 55. The photoelectric sensor 57 is located behind the slit screen 56.

The function of the image-rotating prism 54 is to return the direction of the elongated beam spot rotated by the changeover of the slit in the slit screen 40 back to the original direction. This is necessary to have the longitudinal direction of the elongate laser spot correspond to the direction of the slit of the slit plate 56 as well as to the direction of the grating of a later-described grating slit member of the automatic focus-detecting system. Therefore, the image-rotating prism 54 is rotated interlocking with the slit screen 40 by a driver 27.

Figure 4:
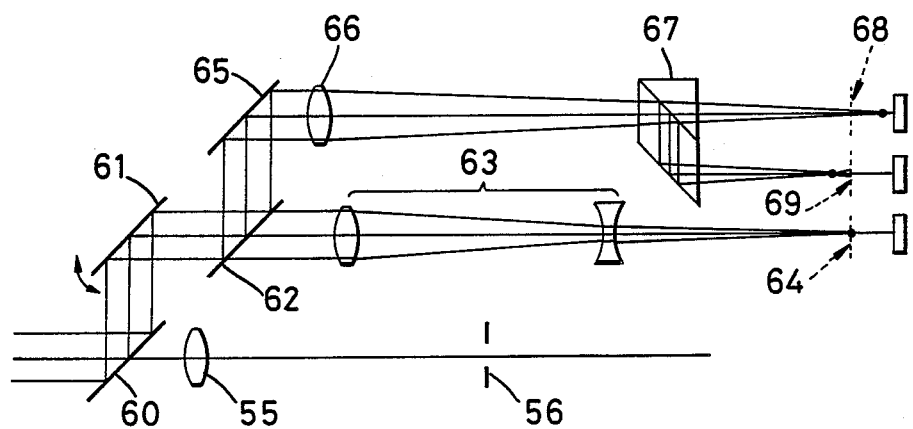
FIG. 4 shows the optical arrangement of an automatic focus-detecting unit.

FIG. 4 shows the arrangement of the elements of the automatic focus-detecting system. The automatic focus detecting system is of the structure known per se which comprises an oscillating mirror 61 for receiving the reflected light from the half-mirror 60, a half-mirror 62, an image-forming lens 63 disposed in the optical path of the transmission light through the half-mirror 62, a grating slit member 64 disposed conjugately with the focal plane of the objective lens 38 and having a vertically elongated grating, a mirror 65 disposed in the optical path of the reflected light from the half-mirror 62, an image-forming lens 66, a beam splitter 67 and grating slit members 68 and 69. Of the two grating slit members the member 68 is disposed in the path of the transmitted light through the beam splitter 67 and at a position in front of the conjugated point with the focal plane of the objective lens 38 (front focus position). The other member 69 is disposed in the path of the reflected light from the beam splitter 67 and at a position behind the conjugated point with the focal plane of the lens 38 (rear focus position).

The width of the grating element of each grating slit member is so selected that the width is substantially equal to the spot size obtained when the spot image is focused on the grating. Behind these grating slit members 64, 68, 69 there are arranged photoelectric sensors respectively.

The viewing optical system comprises a dichroic mirror 70, an illumination system for sending a viewing illumination light beam to the mirror 70 and an image-forming optical system for TTL viewing. The dichroic mirror 70 is on the optical axis of the objective lens 38 and transmits laser beam while reflecting viewing light.

The illumination system is composed of a light guide 71 for guiding the illumination light from a light source (not shown), a field stop 72 and a condenser lens 73 through which the light beam enters the dichroic mirror 70.

The image-forming optical system is composed of a half-mirror 74, a condenser lens 75, a mirror 76, a focusing screen 77, a field lens 78, a relay lens group 79, a mirror 80 and an ITV image pickup surface 81.

The manner of operation of the above embodiment is as follows:

A linearly polarized laser beam (P-polarized laser light beam) is emitted from the polarized laser light source 21. After the beam width is expanded by the beam expanders 34 and 35, the laser beam is incident on the slit screen 40. Assuming that the slit screen is in the position in which the radial slit 41 is interposed in the collimated beam, the incident light passes through the first slit 41 and enters the polarized beam splitter 50. The laser beam transmitted through the beam splitter enters the quarter wavelength plate 37 through which the laser beam is incident on the objective lens 38. The objective lens forms an image of the beam on the object surface as a beam spot 24 elongated in the direction shown in FIG. 1.

When the stage 22 is moved, the object surface is scanned by the spot 24.

During such movement when the scanning spot 24 falls just on the edge of the pattern on the object surface, there is generated scattered light which is reflected toward the detector 25 by the concave reflecting mirror 26. From the position of the moving stage at the generation of the scattered light, the coordinate position of the edge is measured.

On the other hand, the normally reflected light from the object surface passes through the objective lens 38 and enters the quarter wavelength plate 37 through the dichroic mirror 70. The quarter wavelength plate transforms the reflected light into an S-polarized laser beam which is then reflected by the polarized beam splitter 50. Ideally, the S-polarized laser beam is to be 100% reflected by the polarized beam splitter 50. However, in practice, a portion of the S-polarized beam is transmitted to the slit screen 40 through the beam splitter. If a small portion of the transmitted light through the polarized beam splitter 50 comes back to the laser light source 21, it has an adverse effect on the radiation of the laser which may cause a measuring error.

In order to prevent the above problem of the so-called back talk, the slits of the slit screen 40 are arranged in such manner that even a very small portion of the reflected light can not return to the laser light source 21. More specifically, each of the slits 41, 42, 43, 44 is so formed that when the slit is put in the collimated light, it takes a position deviated from the optical axis 30 of the condensing optical system.

The light reflected by the polarized beam splitter 50 passes through the inverted beam expanders 51 and 52, and is reflected by a mirror 53 toward the image-rotating prism 54. After being image-rotated by the prism 54, the beam is incident on the half-mirror 60. The image-rotating prism 54 is so disposed as to have the longitudinal direction of the laser spot correspond to the direction of the slit of the slit plate 56 as well as to the direction of the respective gratings of the grating slit members 64, 68, 69.

The beam transmitted through the half-mirror 60 is condensed on the slit plate 56 through the focusing lens 55 and then enters the photoelectric sensor 57 which produces a signal corresponding to the difference between bright and dark (difference in reflectance) on the object surface. A proper slice level or sensitivity for edge detection is determined based on the signal.

The beam reflected by the half-mirror 60 is further reflected by the oscillating mirror 61 and enters the half-mirror 62.

The normal reflection light from the half-mirror 62 is further reflected to the lens 66 by the mirror 65 and enters the beam splitter 67 through the focusing lens 66. The normal reflection light transmitted through the beam splitter 67 enters the grating slit member 68 whereas the normal reflection light reflected by the beam splitter 67 enters the grating slit member 69.

On the other hand, the normal reflection light transmitted through the half-mirror 62 is focused through the focusing lens 63 and then enters the grating slit member 64.

A rough adjustment for auto-focusing of the lens 38 is made by means of electric signals generated from the photoelectric sensors behind the grating slit members 68 and 69. And, a fine adjustment for the auto-focusing is made by means of an electric signal from the photoelectric sensor behind the grating slit member 64.

The illumination light of the viewing optical system is guided to the field stop 72 by the light guide 71. The light beam from the field stop 72 passes through the condenser lens 73 and the half-mirror 74, and then it is reflected to the objective lens 38 by the dichroic mirror 70. Through the lens 38 the illumination light is guided to the object surface.

The illumination light reflected upon the object surface passes through the lens 38 and then it is reflected by the dichroic mirror 70 and the half-mirror 74 to the condenser lens 75 through which the reflected illumination light is focused on the focusing screen 77.

The image focused on the focusing screen 77 is refocused on the ITV image pickup surface 81 through the field lens 78, the relay lens group 79 and the mirror 80. The operator can observe the pattern on the ITV image pickup surface.

When it is wished, at the next step, to rotate the direction of the elongated laser spot 24 by 90° from the position shown in FIG. 1, the slit screen 40 is rotated 90° clockwise from the position in FIG. 1. By this rotation, the second slit 42 is brought into the collimated beam. Consequently, the direction of the elongated laser spot 24 is shifted by 90°.

Interlocking with the rotation of the slit screen 40, the image-rotating prism 54 also rotates at the same time. This rotation of the image-rotating prism 54 keeps the laser spot unrotated on the slit plate 56 and on the grating slit members 64, 68, 69. Otherwise the laser spot on the slit plate and the grating slit members must be rotated with the rotation of the slit screen 40. In this embodiment, the rotational angle of the exit beam from the prism 54 relative to the incident beam is changed 90° by a 45° rotation of the image-rotating prism 54.

The direction of the elongated laser spot 24 can be further changed to that of 45° by further rotating the slit screen 40 and the image-rotating prism 54 to bring the slit 43 or 44 into the collimated light beam.

Figure 5:
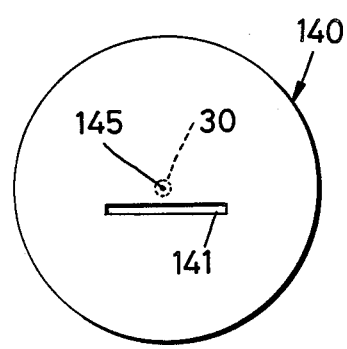
FIG. 5 is a plan view of a modification of the rotary slit screen.

A modification of the slit screen is shown in FIG. 5.

In this modification, the slit screen 140 has a slit 141 deviated from the rotation axis 145 which is in alignment with the optical axis 30 of the focusing optical system. The direction of the spot on the object surface can be changed as desired by rotating the slit screen 140 by a driver. In this modification also the image-rotating prism 54 is rotated in link with the rotation of the slit screen 140.

Obviously many modifications and variations of the present invention are possible in light of the above teachings.

I claim:

1. Apparatus for detecting the edge of a pattern on an object surface, comprising:
    light source means for emitting a collimated light beam;
    a slit screen member having at least one slit for allowing light to pass therethrough and disposed in said collimated light beam;
    a condensing optical system for focusing the collimated light beam passed through said slit on the object surface to form a light spot on the object surface which is elongated in a direction determined by the direction of said slit;
    signal forming means including an image-forming optical system for focusing reflected light from the object surface illuminated by the light spot to form an image of said elongated light spot, said signal forming means forming an output signal corresponding to said light spot image;

image rotating means disposed in the optical path of said reflected light passing through the image-forming optical system; and driving means for changing the direction of the slit to change the direction of the elongated light spot on the object surface and driving said image rotating mean in accordance with the change of the direction of the slit so as to keep the light spot image formed by the image-forming optical system unchanged in direction.

2. Apparatus according to claim 1, wherein said image rotating means includes an image rotator mounted for rotation about a rotation axis parallel with the optical path of said reflected light to rotate light exiting from said image rotator relative to light incident on said image rotator about the rotation axis in accordance with the rotation of said image rotator.

3. Apparatus according to claim 1, which further comprises means for detecting scattered light generated at the edge of the pattern on the object surface when the pattern edge is illuminated by said light spot.

4. Apparatus according to claim 3, wherein said scattered light detecting means includes a sensor for forming a photoelectric output corresponding to detected scattered light and wherein said output signal is used to set the light detection sensitivity of said sensor.

5. Apparatus according to claim 1, wherein said slit screen member comprises a screen disk having plural slits formed therein and rotatable in a plane intersecting the collimated light beam, said slits being distributed in different positions in the disk and extending in different directions relative to the radial direction of the disk.

6. Apparatus according to claim 5, wherein said disk has plural rotational angular positions to each of which said disk can be rotated by said driving means to bring a corresponding one of said slits into the collimated light beam.

7. Apparatus according to claim 6, wherein every slit in the disk is so formed that said corresponding one in the collimated light beam is at a position deviated from the optical axis of the condensing optical system.

8. Apparatus according to claim 1, wherein said light source means and said condensing optical system have a common optical axis and said slit screen member has a rotation axis aligned with the common optical axis and wherein said at least one slit is provided in the vicinity of the rotation axis.

9. Apparatus according to claim 1, wherein said image-forming optical system focuses light reflected by the object surface and collimated through the condensing optical system.

10. Apparatus according to claim 9, wherein said image-forming optical system includes an inverted beam expander for reducing the beam diameter of said reflected, collimated light and a focusing member for focusing the beam diameter-reduced light.

11. Apparatus according to claim 10, wherein said image rotating means is disposed between the inverted beam expander and the focusing member.

12. Apparatus according to claim 9, wherein said image-forming optical system includes a polarized beam splitter disposed between the slit screen member and the condensing optical system and a quarter wavelength member disposed between the polarized beam splitter and the condensing optical system.

13. Apparatus for detecting the edge of a pattern on an object surface, comprising:

light source means for emitting a collimated light beam;

a condensing optical system for focusing the collimated light beam on the object surface to form a light spot on the object surface;

an optical means disposed in the collimated light beam for processing said beam in such manner that the light spot has an illumination area in a determined direction on the object surface;

signal forming means including an image-forming optical system for focusing reflected light from the object surface illuminated by the light spot to form an image of said light spot, said signal forming means forming an output signal corresponding to said light spot image;

image rotating means disposed in the optical path of said reflected light passing through the image-forming optical system; and driving means for operating said optical means to change the direction of said illumination area of the light spot on the object surface and driving said image rotating means in accordance with the operation of said optical means so as to keep the light spot image formed by the image-forming optical system unchanged in direction.

* * * * *